(12) United States Patent
Sekine et al.

(10) Patent No.: US 8,377,565 B2
(45) Date of Patent: *Feb. 19, 2013

(54) FILLING MATERIAL AND FILLING METHOD USING THE SAME

(75) Inventors: Shigenobu Sekine, Tokyo (JP); Yurina Sekine, Tokyo (JP); Yoshiharu Kuwana, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/084,847

(22) Filed: Apr. 12, 2011

(65) Prior Publication Data

US 2011/0262762 A1      Oct. 27, 2011

(30) Foreign Application Priority Data

Apr. 22, 2010   (JP) .................................. 2010-098664

(51) Int. Cl.
*B22F 7/00*      (2006.01)
*B32B 15/01*     (2006.01)

(52) U.S. Cl. ........ 428/548; 428/546; 428/615; 428/621; 428/635

(58) Field of Classification Search .......... 428/615–618, 428/546, 548, 621, 635
See application file for complete search history.

(56) References Cited

U.S. PATENT DOCUMENTS

| 7,423,222 B2 * | 9/2008 | Sugawa et al. ................ 174/264 |
| 7,910,837 B2 * | 3/2011 | Sekine et al. ................. 174/262 |
| 8,079,131 B2 * | 12/2011 | Sekine et al. ................ 29/527.5 |

FOREIGN PATENT DOCUMENTS

| JP | 2002-237468 A | 8/2002 |
| JP | 2002-368082 A | 12/2002 |
| JP | 4278007 B1 | 6/2009 |
| WO | 2009/044958 A1 | 4/2009 |

OTHER PUBLICATIONS

European Search Report dated Aug. 11, 2011, issued in corresponding European patent Application No. 11250467.5.

* cited by examiner

*Primary Examiner* — Cathy Lam
(74) *Attorney, Agent, or Firm* — Westerman, Hattori, Daniels & Adrian, LLP

(57) ABSTRACT

A filling material includes a support base member and a metal layer, the metal layer including a first metal layer and a second metal layer and being disposed on one side of the support base member, the first metal layer being an aggregate of nano metal particles and having a film thickness enabling melting at a temperature lower than a melting point, the second metal layer being an aggregate of metal particles having a lower melting point than the first metal layer.

4 Claims, 2 Drawing Sheets

FILLING MATERIAL AND FILLING METHOD USING THE SAME

BACKGROUND OF THE INVENTION

1. Field of the Invention

The present invention relates to a filling material to be used for filling a metal or alloy conductor into a minute space and a filling method using the same.

2. Description of the Related Art

As means for realizing a three-dimensional circuit configuration in electronic devices including various scales of integrated circuits and various types of semiconductor devices and chips thereof, there has been proposed a TSV (through-silicon-via) technology of providing a circuit board with a large number of through electrodes and stacking these circuit boards. With the TSV technology, many functions can be packed into a small footprint. In addition, important electrical pathways between devices can be dramatically shortened to facilitate increasing processing speed. Japanese Unexamined Patent Application Publication Nos. 2002-237468 & 2002-368082 disclose a molten metal filling method as a through electrode forming technology essential to the TSV technology.

When using the above molten metal filling method for forming a through electrode in a semiconductor chip or a wafer previously formed with a semiconductor circuit element (via-last), it is necessary to avoid thermal deterioration of the semiconductor circuit element and an accessory organic substance of the wafer due to the heat of fusion. In order to avoid the thermal deterioration, a metal material having a melting point of about 200° C. or less has to be employed as a metal material for forming the through electrode.

In order to realize a three-dimensional circuit configuration, on the other hand, a plurality of wafers obtained by using the TSV technology have to be stacked and joined together in an atmosphere having a temperature of 300° C. or more.

However, while the melting point of the metal material for forming the through electrode is 200° C. or less, the heat treatment temperature for joining the wafers in a stacked state is 300° C. or more, so that the through electrode may be melted at the joining process of the wafers.

SUMMARY OF THE INVENTION

It is an object of the present invention to provide a filling material which can be melted at a low temperature upon filling but ensures a high melting point after solidification and a filling method using the same.

It is another object of the present invention to provide an easy-to-handle filling material and a filling method using the same.

In order to achieve the above object, a filling material according to the present invention comprises a support base member and a metal layer. The metal layer includes a first metal layer and a second metal layer and is disposed on one side of the support base member. The first metal layer is an aggregate of nano metal particles and has a film thickness enabling melting at a temperature lower than a melting point. The second metal layer is an aggregate of metal particles having a lower melting point than the first metal layer.

It is known that most metal particles can be melted at a temperature lower than a melting point by reducing their particle size. In this specification, the melting point reduction effect due to the refining is referred to as "small size effect". This small size effect can be obtained even if "particle size" is replaced by "film thickness". That is, the small size effect of enabling melting at a temperature lower than a melting point can be obtained by reducing a film thickness of a metal layer.

In the present invention, the first metal layer is an aggregate of nano metal particles and has a film thickness enabling melting at a temperature lower than a melting point. In other words, the nano metal particles or the film thickness of the first metal layer is in such a range as to produce the small size effect. Therefore, the melting point reduction effect can be obtained because of the small size effect.

If the particle size (film thickness) of the metal layer is reduced to a level as small as a de Broglie wavelength of atoms (several nm to 20 nm), there can be produced quantum size effect. With the quantum size effect, the first metal layer being a high melting point metal material can be melted at a temperature of, for example, 250° C. or less, preferably, 200° C. or less, more preferably, 180° C. or less.

The filling material according to the present invention includes not only the first metal layer but also the second metal layer. The second metal layer is an aggregate of metal particles having a lower melting point than the first metal layer. That is, it is made of a low melting point metal material.

For filling a metal into a minute space formed in a substrate and hardening the filled metal with the filling material according to the present invention, one side of the filling material having the metal layer is applied to one side of the substrate having an opening of the minute space, and then the filling material is heated and pressed to fill a melt of the metal layer into the minute space.

At the above heating and pressing step, the first metal layer materially has a high melting point but can be melted at a temperature lower than the melting point because of the small size effect or the quantum size effect, while the second metal layer can be melted by the heat of fusion of the first metal layer and pressure-filled into the minute space.

Accordingly, it can be melted and filled into the minute space at a low temperature that will never cause thermal deterioration of a previously formed semiconductor circuit element and an accessory organic substance.

Moreover, since heat resistance due to the high melting point of the first metal layer can be ensured after solidification, the metal conductor within the minute hole can be prevented from being melted by the heat upon stacking and joining the wafers.

Furthermore, since the filling material according to the present invention has the metal layer on at least one side of the support base member, the strength increasing effect can be obtained by the support base member, unlike a metallic sheet only of a metal. This makes it easy to handle when filling the metal into the minute space formed in the substrate, improving workability accordingly.

Still furthermore, since the strength increasing effect can be obtained for the metal layer by the support base member, the metal layer can be prevented from being broken or damaged.

The support base member being a component of the filling material can be peeled off after hardening of a metal conductor formed by the metal filled into the minute space. Therefore, the downstream processing operation also becomes extremely easy to perform.

Preferably, the pressing is continued until the melt of the metal layer filled into the minute space is hardened. This makes it possible to suppress deformation of the filled metal conductor due to thermal contraction.

It should be noted that in the present invention, "metal" refers to materials made of a single metal element and alloys thereof. These alloys include solid solutions, eutectics, and intermetallic compounds.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
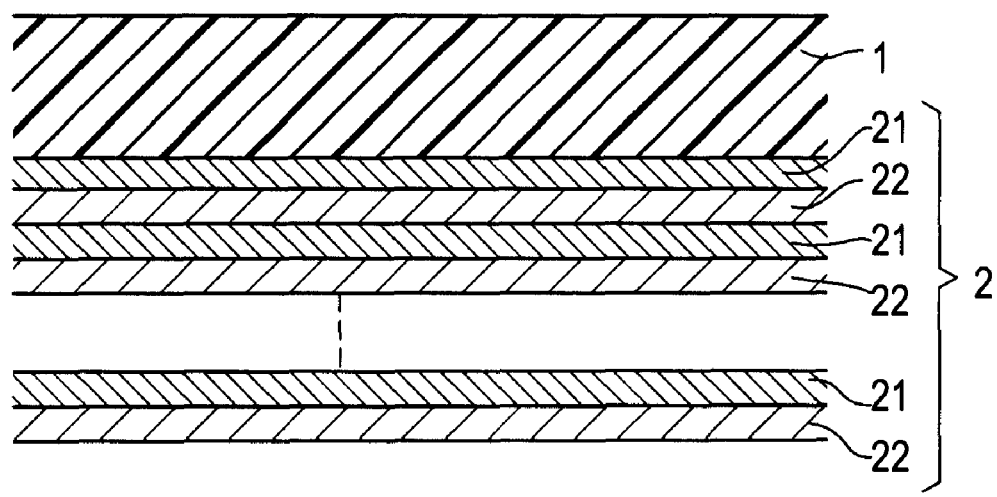
FIG. 1 is a sectional view showing a part of a filling material according to the present invention.

Referring to FIG. 1, a filling material according to the present invention has a metal layer 2 on at least one side of a support base member 1. The support base member 1 has the form of a film or sheet having a thickness of about 1 to 200 μm and can be made of a glass or a heat-resistant synthetic resin film. Preferably, the heat-resistant synthetic resin film has a short-term heat resistance of 200° C. or more and a long-term heat resistance of 150° C. or more. Such a heat-resistant synthetic resin film has been commercially available.

The metal layer 2 includes a first metal layer 21 and a second metal layer 22. The first metal layer 21 and the second metal layer 22 are stacked on one side of the support base member 1. The illustrated metal layer has a plurality n of pairs of the first metal layer 21 and the second metal layer 22 (n=1, 2, 3 and so on). The first metal layer 21 and the second metal layer 22 can be directly formed on the support base member 1 by using a thin-film deposition technique such as vacuum deposition, sputtering or ion plating. The figure shows an embodiment where the second metal layer 22 is laid on the first metal layer 21, but they may be inverted.

The first metal layer 21 is an aggregate of nano metal particles having a film thickness within a range enabling melting at a temperature lower than the original melting point of its metal material, for example, within a range of 500 nm or less, preferably, 200 nm or less, more preferably, 100 nm or less. Particularly when the particle size of the nano metal particles is 20 nm or less, they exhibit the quantum size effect and are therefore allowed to melt at a temperature that is considerably lower than the melting point of the constituent material, for example, 250° C. or less, preferably, 200° C. or less, more preferably, 180° C. or less. The film thickness of the first metal layer 21 can be controlled by the particle size of the metal particles.

The first metal layer 21 may be made of a material containing at least one component selected from the group consisting of transition elements, Al, Zn and a metal for a wiring conductor of a semiconductor. Specifically, the transition elements include Ag, Cu, Au, Pt, Ni, Pd, Ir, W, Mo, Ta, Hf, Ru, Rh, Sc, Zr, Os, Y, V, Fe, Co, Cr, Mn and Nb. In this case, for instance, the melting point of Ag is 961.93° C., the melting point of Cu is 1083.4° C., the melting point of Au is 1064.43° C., the melting point of Pt is 1769° C., the melting point of Ti is 1660° C., the melting point of Zn is 419.58° C., the melting point of Al is 660.4° C., the melting point of Ni is 1453° C., the melting point of W is 3387° C., and the melting point of Mo is 2623° C. Because of the quantum size effect, the first metal layer 21 made of such a high-melting point metal material is allowed to melt at a temperature of, for example, about 250° C., preferably, 200° C. or less.

The second metal layer 22 has a lower melting point than the first metal layer 21 and is allowed to melt by the heat of fusion of the first metal layer 21. Thus, the second metal layer 22 can be melted along with melting of the first metal layer 21. Specifically, the metal material for forming the second metal layer 22 may be at least one component selected from the group consisting of Sn, In, Bi and Ga. The melting point of Sn is 232° C., the melting point of In is 156.61° C., and the melting point of Bi is 271.3° C. In view of the meltability, preferably, the film thickness of the second metal layer 22 is set within the range of 1 to 300 μm.

In order to form a low electrical resistance connection by reducing an oxide film, which may be formed on a metal conductor, when connecting one metal conductor formed within a minute space to another metal conductor, moreover, the metal layer 2 may also contain a noble metal layer. The noble metal layer can be made of at least one component selected from the group consisting of Au, Ag, Pt, Pd, Rh, Ir, Ru and Os. Among these elements, it is preferred to contain at least one component selected from the group consisting of Au, Pt and Pd.

Figure 2:
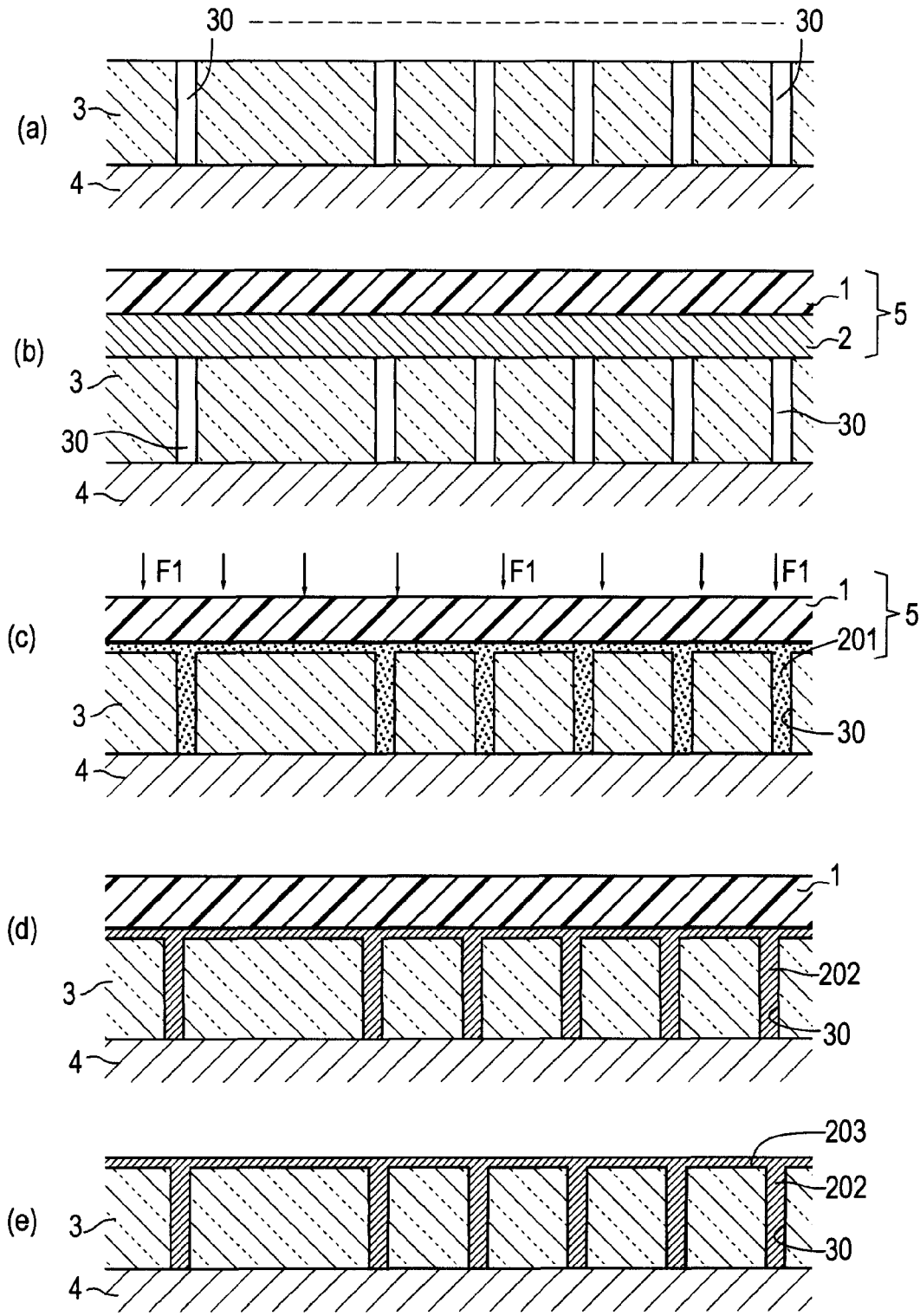
FIG. 2 is a diagram showing processes of a filling method according to the present invention.

Referring to FIG. 2, next will be described a filling method using the filling material shown in FIG. 1. At first, as shown in FIG. 2(a), a substrate 3 to be processed is set on a support device 4 disposed within a vacuum chamber. The substrate 3 has minute spaces (vertical holes) 30 extending in its thickness direction. The minute spaces 30 should have an opening in the outer surface of the substrate 3, but their opening shape, path, number and so on may be determined arbitrarily. They are not required to be the illustrated through-hole but may be a non-through-hole. They may also have a complicated shape not only extending in the vertical direction of the figure but also connecting together in a transverse direction perpendicular thereto.

Typically, the substrate 3 is, but not limited thereto, a wafer for a semiconductor device. The present invention is generally applicable to the case where a metal should be filled into the minute spaces 30 of the substrate 3 and then hardened, and therefore is generally applicable to the case where a small metal conductor-filled structure or a functional portion should be formed, for example, inside another type of electronic device, micromachine or the like.

For the substrate 3, moreover, various materials may be used as long as having heat resistance to heat that will be applied at the melting process, including a metal, an alloy, a metal oxide, a ceramic, a glass, a plastic, a composite thereof, and a laminate thereof.

The physical properties and structure of the substrate 3 vary depending on the type of the target device. For a semiconductor device, for example, it may be a Si wafer, a SiC wafer, a SOI wafer or the like. For a passive electronic circuit device, it may take the form of a dielectric, a magnetic or a composite thereof. Also when manufacturing a MRAM (magnetoresistive random access memory), a MEMS (micro electro mechanical systems) or an optical device, a wafer to be used should have physical properties and structure meeting the requirements. The minute space 30 in the wafer is generally called "through-hole", "non-through-hole (blind hole)", or "via hole". The minute space 30 has a hole diameter of, for example, 60 μm or less. The thickness of the wafer itself is typically tens of μm.

Then, the internal pressure of the vacuum chamber is reduced, for example, to a vacuum degree of about $10^{-3}$ Pa by performing evacuation of the vacuum chamber. However, the above vacuum degree is a mere example and should not be construed as limited thereto.

Next, as shown in FIG. 2(b), one side of the filling material 5 shown in FIG. 1, i.e., the side having the metal layer 2 is applied to one side of the substrate 3 having an opening of the minute space 30. Since the filling material according to the present invention has the metal layer 2 on at least one side of the support base member 1, the strength increasing effect can be obtained by the support base member 1, unlike a metallic sheet only of a metal. This makes it easy to handle when filling the metal into the minute space 30 formed in the substrate 3, improving workability accordingly.

Next, as shown in FIG. 2(c), the filling material 5 is heated and pressed as indicated by F1 to melt and push the metal layer 2 into the minute space 30. The heating and pressing of the filling material 5 can be performed by a heat press, for example. The processes from FIG. 2(a) to FIG. 2(c) should basically be performed in a reduced-pressure atmosphere within the vacuum chamber. With this, a molten metal 201 can be vacuum-sucked into the minute space 30, whereby the molten metal 201 can be filled into the minute space 30.

The heat treatment temperature for melting can be set within the range of 200 to 300° C., for example. In the filling material according to the present invention, the first metal layer 21 can be melted at a temperature lower than the heat treatment temperature of 200 to 300° C. because of the small size effect or the quantum size effect of the film thickness. Moreover, the second metal layer 22 can be melted by the heat of fusion of the first metal layer 21 and pressure-filled into the minute space 30. This makes it possible to form a vertical conductor without causing thermal deterioration of a previously formed semiconductor circuit element and an accessory organic substance.

The pressure F1 may be applied as a pressing pressure using a mechanical pressing means or a rolling pressure or by increasing the atmospheric gas pressure inside the vacuum chamber from its pressure reduced state.

The strength of the pressure F1 can be determined in view of the mechanical strength of the substrate 3 and the aspect ratio of the minute space 30. In the case where the substrate 3 is a silicon wafer, for example, the pressure F1 is preferably set within a range higher than the atmospheric pressure but equal to or lower than 2 kgf/cm². If the mechanical strength of the substrate 3 and the aspect ratio of the minute space 30 are sufficiently large, it is possible to apply a much higher pressure.

In order to increase the gas pressure inside the vacuum chamber, preferably, an inert gas such as $N_2$ gas is supplied to the vacuum chamber for increasing the gas pressure while preventing oxidation of the molten metal material.

Moreover, it is also possible to perform the filling utilizing ultrasonic vibration or magnetic force. In the case of the filling with ultrasonic vibration, the ultrasonic vibration can be applied to the substrate 3 or the pressing means.

The next is a hardening process where the molten metal 201 within the minute space 30 is cooled and hardened while maintaining the pressure F1. With this, a metal conductor (vertical conductor) 202 can be obtained as shown in FIG. 2(d). Since heat resistance due to the high melting point of the first metal layer 21 can be ensured after solidification, the metal conductor can be prevented from being melted by the heat upon stacking and joining the wafers.

Basically, the pressure F1 should be continuously applied until the hardening is completed, but it is also possible to stop at a stage where the hardening has progressed to a certain degree. Basically, the cooling under pressure should be performed slowly at a room temperature, but the temperature condition may be set lower than the room temperature, or in some cases, the temperature condition may be set higher than the room temperature. Moreover, the cooling method may be such that the temperature is decreased continuously or in a stepwise fashion with time.

The pressing at the hardening process may be performed separately or continuously from the pressing at the filling process. When performed continuously, the two pressing processes can be integrated into a single pressing process. A typical example can be found in the case where the gas pressure inside the vacuum chamber is increased to a degree higher than the atmospheric pressure.

As shown in FIG. 2(e), the support base member 1 of the filling material 5 is peeled off after the hardened metal conductor 202 is obtained in the minute space 30.

If a metal thin film 203 is left over the openings, as shown in FIG. 2(e), it is possible to add a process of remelting the metal thin film 203 over the openings and wiping off the remelted metal thin film 203.

However, this downstream process is intended to remove the metal thin film 203 and flatten one side of the substrate 3 and therefore can be omitted if the flattening is not required. The metal thin film 203 may also be patterned by using a fine pattern formation technique such as photolithography.

It should be noted that all the processes described above are not required to be performed within the vacuum chamber. The hardening process and the downstream process may be performed outside the vacuum chamber.

The filling material and the filling method according to the present invention are generally applicable to realize a three-dimensional arrangement electronic device and a circuit board therefor. More specifically, it may be a system LSI, a memory LSI, an image sensor, a MEMS or the like. It may also be an electronic device including an analog or digital circuit, a memory circuit such as a DRAM, a logic circuit such as a CPU or the like or an electronic device that is obtained by preparing different types of circuits such as an analog high frequency circuit and a low frequency, low power consumption circuit in different processes and stacking them. More specifically, they include most of electronic devices having an electronic circuit as a functional element, such as a sensor module, an optoelectronic module, a unipolar transistor, a MOS FET, a CMOS FET, a memory cell, integrated circuits (IC) thereof, or various scales of LSIs.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A filling material comprising a support base member and a metal layer, the metal layer including a first metal layer and a second metal layer, the metal layer being disposed on one side of the support base member, the first metal layer being an aggregate of nano metal particles and having a film thickness enabling melting at a temperature lower than a melting point of a first metal of the first metal layer, the second metal layer being an aggregate of metal particles, a second metal of the second metal layer having a lower melting point than the first metal, wherein a plurality of pairs of the first metal layer and the second metal layer are included in the filling material, and wherein a particle size of the nano metal particles is several nm to 20 nm.

2. The filling material of claim 1, wherein the first metal layer and the second metal layer contain at least one component selected from the group consisting of Ag, Cu, Au, Pt, Ni, Pd, Ir, W, Mo, Ta, Hf, Ru, Rh, Sc, Zr, Os, Y, V, Fe, Co, Cr, Mn, Nb, Al, Zn, Ga, Sn, In, and Bi.

3. A filling material according to claim 1, wherein the first metal layer melts at a temperature of 250° C. or less.

4. A filling material according to claim 1, wherein the first metal layer melts at the temperature lower than the melting point of the first metal due to a melting point reduction effect by a small size effect.

* * * * *